(12) United States Patent
Jarrar et al.

(10) Patent No.: US 10,855,257 B2
(45) Date of Patent: Dec. 1, 2020

(54) PULSED LATCH SYSTEM WITH STATE RETENTION AND METHOD OF OPERATION

(71) Applicant: NXP USA, Inc., Austin, TX (US)

(72) Inventors: Anis Mahmoud Jarrar, Austin, TX (US); David Russell Tipple, Leander, TX (US); Viacheslav Sergeyevich Kalashnikov, Moscow (RU); Mikhail Yurievich Semenov, Zelenograd (RU)

(73) Assignee: NXP USA, Inc., Austin, TX (US)

( * ) Notice: Subject to any disclaimer, the term of this patent is extended or adjusted under 35 U.S.C. 154(b) by 355 days.

(21) Appl. No.: 15/797,025

(22) Filed: Oct. 30, 2017

(65) Prior Publication Data

US 2018/0294799 A1    Oct. 11, 2018

(30) Foreign Application Priority Data

Apr. 7, 2017  (RU) ................................ 2017111828

(51) Int. Cl.
*H03K 3/012* (2006.01)
*H03K 3/356* (2006.01)
*H03K 19/20* (2006.01)

(52) U.S. Cl.
CPC ....... *H03K 3/012* (2013.01); *H03K 3/356008* (2013.01); *H03K 19/20* (2013.01)

(58) Field of Classification Search
CPC ............. H03K 3/012; H03K 3/356008; H03K 3/356113; H03K 3/356147; H03K 3/356156; H03K 19/20
See application file for complete search history.

(56) References Cited

U.S. PATENT DOCUMENTS

| | | | | |
|---|---|---|---|---|
| 7,583,121 B2* | 9/2009 | Berzins | ............ | H03K 3/356008 327/202 |
| 7,791,389 B2* | 9/2010 | Remington | ............ | H03K 3/012 327/202 |
| 8,289,060 B2* | 10/2012 | Tower | .................. | H03K 3/0375 327/215 |
| 8,456,214 B2* | 6/2013 | Frederick, Jr. | ........ | H03K 5/1534 327/208 |
| 8,816,741 B2* | 8/2014 | Liu | ........................ | H03K 3/012 327/212 |
| 2008/0238514 A1 | 10/2008 | Kim | | |
| 2014/0266365 A1* | 9/2014 | Penzes | .................. | H03K 3/012 327/203 |

FOREIGN PATENT DOCUMENTS

KR  100630740 A   9/2006

* cited by examiner

*Primary Examiner* — Patrick O Neill

(57) ABSTRACT

An integrated circuit includes a pulse generator having at least one delay circuit with an input that receives a clock signal and an output that provides a delayed clock pulse. The delayed clock pulse has a width proportional to an amount of time required to maintain a magnitude of the clock signal. A pulse latch circuit includes a clock input coupled to receive the delayed clock pulse, a data input coupled to receive a data value, and a data output, wherein the pulse latch circuit outputs and holds the data value at the data output each time the delayed clock pulse is provided at the clock input, and the pulse latch circuit operates on a continuous voltage source that supplies power during power on and power off modes.

19 Claims, 4 Drawing Sheets

PULSED LATCH SYSTEM WITH STATE RETENTION AND METHOD OF OPERATION

BACKGROUND

Field

This disclosure relates generally to pulsed latch systems, and more specifically, to a pulsed latch system with state retention.

Related Art

Reducing static and dynamic power is a common goal in system on chip (SoC) designs. Lower power may translate to longer battery life, higher reliability, and helps in reducing overall system cost in terms of lower cost packages, reduced cooling requirements, and the like. However, most low power techniques involve a trade-off between area, performance, and design complexity. Therefore, it is desirable to reduce both area and power without overly increasing a design's complexity, especially within standard cell designs which are highly repeated in a system. For example, it is desirable to have a reduced power latch which may be used within a standard cell design. It is also desirable to have a reduced power latch which is capable of state retention so that state is not lost when the combinational logic portion of the SoC is powered down.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Latches are commonly used as storage elements throughout a circuit design. One type of latch is a pulsed latch which utilizes a pulsed clock and is capable of state retention. In one embodiment, a pulsed latch system includes a pulsed latch and a pulse generator. To reduce leakage power while allowing for state retention, the pulsed latch system is powered by two different power supplies, a continuous supply (VDDC) and a switchable supply (VDD) (which may also be referred to as a non-continuous voltage supply). The state retention portion of the pulsed latch system is powered by VDDC and the rest of the pulsed latch system, including the pulse generator, is powered by the switchable supply which can be turned off during low power mode or other standby modes. In one embodiment, the continuous supply supplies power during power on and power off modes, and the switchable power supply provides a non-zero supply voltage only in a power-on mode. Furthermore, compared to a traditional master-slave flip-flop, a pulsed latch needs only one latch rather than two latches (the master latch and slave latch). Therefore, using pulsed latches instead of MSFFs may allow for both power and area savings. Although a pulsed latch requires a pulse clock unlike a MSFF, whose latches are driven by two opposite edges of the clock, this overhead can be reduced by using the pulse clock generator in a multi-bit configuration.

Figure 1:
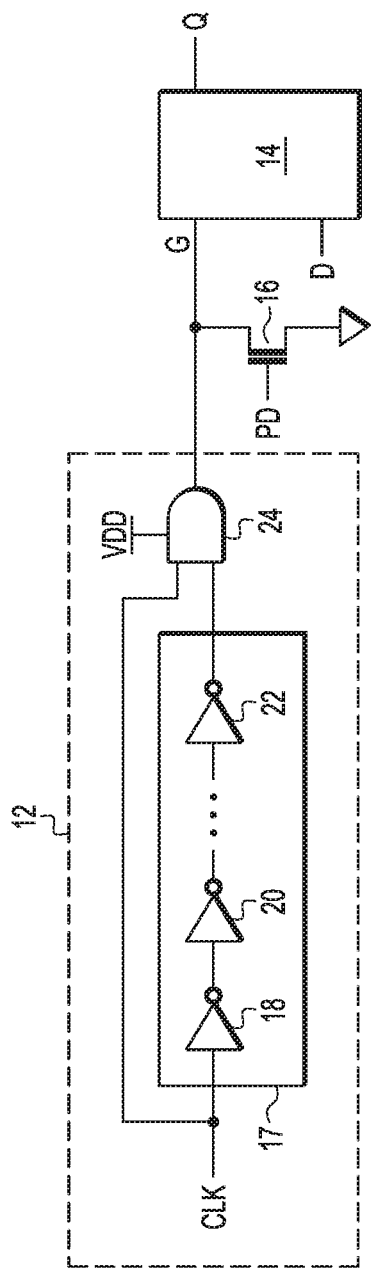
FIG. 1 illustrates, in schematic form, a pulsed latch system having a pulse generator and a pulsed latch, in accordance with one embodiment of the present invention.

FIG. 1 illustrates, in schematic form, a pulsed latch system 10 which includes a pulsed latch 14 with state retention, a pull-down N-type device 16, and a pulse generator 12, in accordance with one embodiment of the present invention. System 10 may be implemented as an integrated circuit and may be used within an SoC. Pulse generator 12 includes a delay chain 17 of series connected inverters (including inverters 18, 20, and 22), and an AND gate 24. A first input of AND gate 24 is coupled to receive a clock signal, CLK. An input of inverter 18 (corresponding to an input of chain 17) is coupled to receive CLK and an output of inverter 18 is coupled to an input of inverter 20. An output of inverter 20 is coupled, via any number of additional series connected inverters of chain 17, to an input of inverter 22. An output of inverter 22, corresponding to an output of chain 17, is coupled to a second input of AND gate 24. In the illustrated embodiment, in order for pulse generator 12 to produce a pulse, chain 17 includes an odd number of inverters. Note that in alternate embodiments, delay chain 17 may include additional or other circuit elements or logic gates. In yet another embodiment, a delay can be achieved by a feedback delay chain coupled between the output of AND gate 24 and the second input of AND gate 24. AND gate 24 is coupled to a first power supply node which receives switchable power supply, VDD.

Still referring to FIG. 1, a first current electrode of device 16 is coupled to the output of AND gate 24 and a second current electrode is coupled to a second power supply node, e.g. ground. A control electrode of device 16 is coupled to receive a power down signal, PD. When PD is asserted (e.g. a logic level high), system 10 is in a power down mode (e.g. a low power mode) and when PD is negated (e.g. a logic level low), system 10 is in normal operation. Pulsed latch 14 has a first input G, a second input D, and an output Q. During normal operation, the value at input D is latched and provided as output Q each time a positive pulse edge is received at input G. Further operation details will be provided with respect to FIGS. 2 and 3 below.

Figure 2:
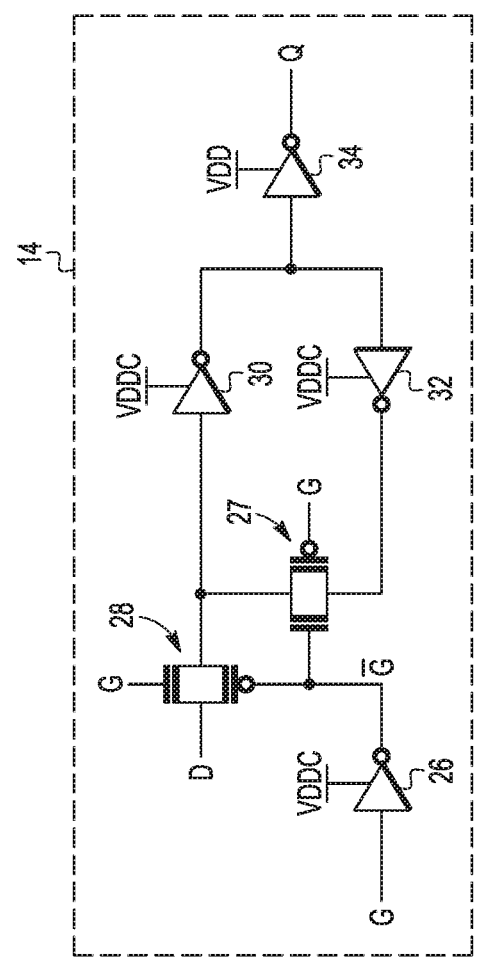
FIG. 2 illustrates, in schematic form, the pulsed latch of FIG. 1, in accordance with one embodiment of the present invention.

FIG. 2 illustrates, in schematic form, a more detailed view of pulsed latch 14. Pulsed latch 14 includes inverters 26, 30, 32, and 34, and transmission gates 27 and 28. Each of transmission gates 27 and 28 include an N-type device coupled to a P-type device, in which a first current electrode of the N-type device is connected to a first current electrode of the P-type device, and a second current electrode of the N-type device is connected to a second current electrode of the P-type device. The first current electrodes of the N-type and P-type devices correspond to a first data terminal of the transmission gate and the second current electrodes of the N-type and P-type devices corresponds to a second data terminal of the transmission gate. The control electrode of the N-type device corresponds to a first control terminal of the transmission gate, and the control electrode of the P-type device corresponds to a second control terminal of the transmission gate. An input of inverter 26 is coupled to input G, and an output of inverter 26 provides G* and is coupled to the first control terminal of transmission gate 27 and the second control terminal of transmission gate 28. The second control terminal of transmission gate 27 and the first control terminal of transmission gate 28 are each coupled to input G. Input D is coupled to the first data terminal of transmission gates 28. The second data terminal of transmission gate 28 is coupled to the first data terminal of transmission gate 27 and to an input of inverter 30. The second data terminal of transmission gate 27 is coupled to an output of inverter 32. An output of inverter 30 is coupled to an input of inverter 32 and an input of inverter 34. An output of inverter 34 provides output Q of pulsed latch 14. Inverters 26, 30, and 32 are coupled to a third power supply node which receives the continuous power supply VDDC. Inverter 34 is coupled to the first power supply node which receives switchable power supply VDD.

Figure 3:
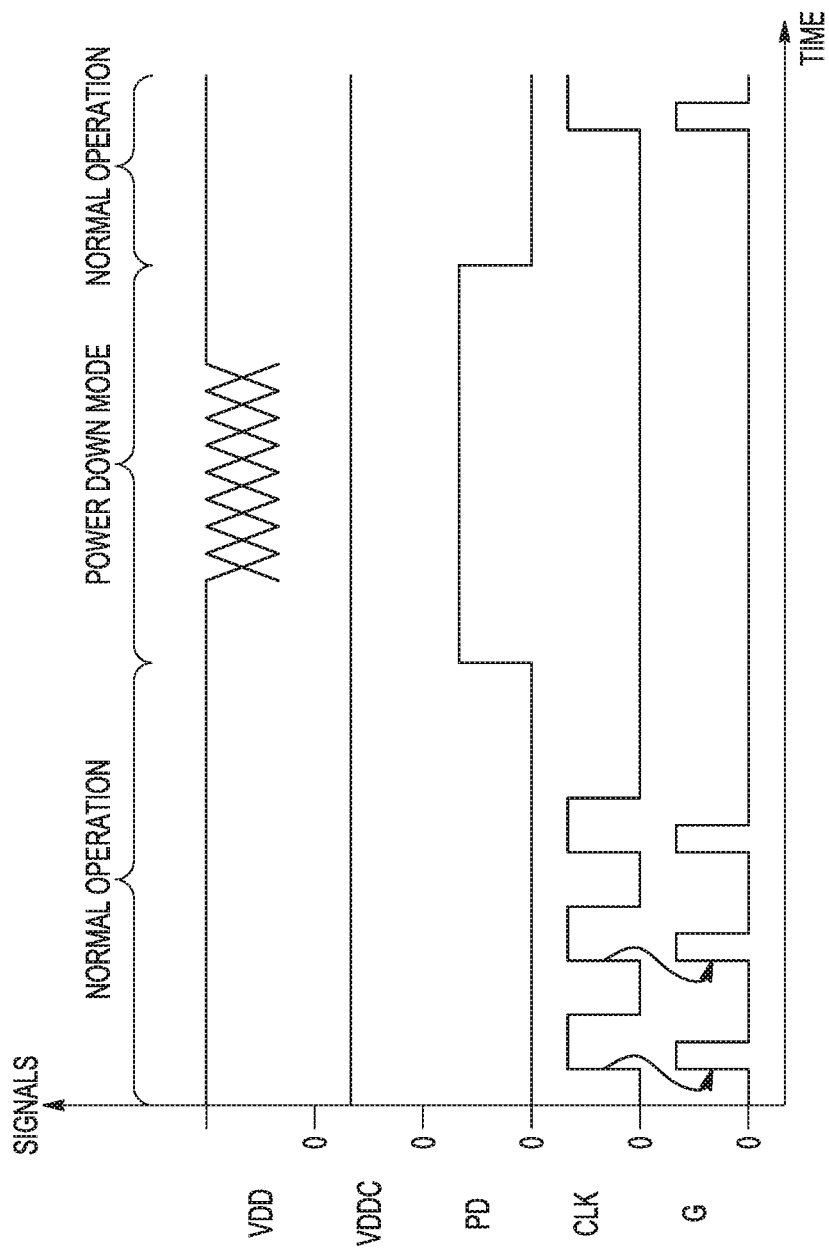
FIG. 3 illustrates a timing diagram including various signals of the pulsed latch system of FIG. 1, in accordance with one embodiment of the present invention.

Operation of pulsed latch system 10 will be discussed in reference to the timing diagram of FIG. 3. During normal operation, when power is applied such that VDD and VDDC are both powered (in a power up mode in which both VDD and VDDC provide a non-zero supply voltage), PD is a logic level low. This turns off device 16 which allows pulse generator 12 to provide pulses at input G to pulsed latch 14. Therefore, during normal operation, as seen in FIG. 3, a pulse is applied to input G in response to each rising edge of CLK, in which the pulse width of the pulse is determined by the delay of chain 17. Therefore, the pulse width is determined by the delay provided by the elements within chain 17. As discussed above, in alternate embodiments, other types of delay circuitry can be used to set the pulse width of the generated pulse. When a positive pulse is received at input G, transmission gate 28 is enabled and transmission gate 27 is disabled, such that the logic value at input D gets transmitted, via transmission gate 28, to the input of inverter 30. The input of inverter 30 propagates through inverter 34 such that the value at D appears at output Q. After the falling edge of the positive pulse, G becomes a logic level low and transmission gate 28 is disabled and transmission gate 27 is enabled. Therefore, the value at the output of inverter 30 is stored in the latch formed by inverters 30 and 32 and enabled transmission gate 27. Thus, each time a pulse is receive at input G, the value at D is latched and provided as Q.

When a power down mode (e.g. a low power mode) is to be entered, CLK is set to low, and one cycle later, PD is asserted to a logic level high. At some point later, VDD is turned off. Therefore, the value of VDD in FIG. 3 becomes indeterminate. With PD asserted, device 16 is turned on, pulling down node G to a logic level low which enables transmission gate 27 while disabling transmission gate 28. Since VDD is removed, inverter 34 and AND gate 24 are powered down, thus saving power. Since VDDC is continuously applied, even during the power down mode, the state of pulsed latch 14 remains stored in the latch formed by inverters 30 and 32 (both powered by VDDC) and transmission gate 27 (which is maintained enabled by G), thus retaining state. Upon exiting the power down mode, VDD is first restored, and PD is again negated to a logic level low. One cycle after PD is negated, the CLK is no longer held low such that normal operation resumes. Note that in this embodiment, CLK is held low until after PD is negated. This ensures that while VDD is applied, the output of AND gate 24 remains at a logic level low.

Figure 4:
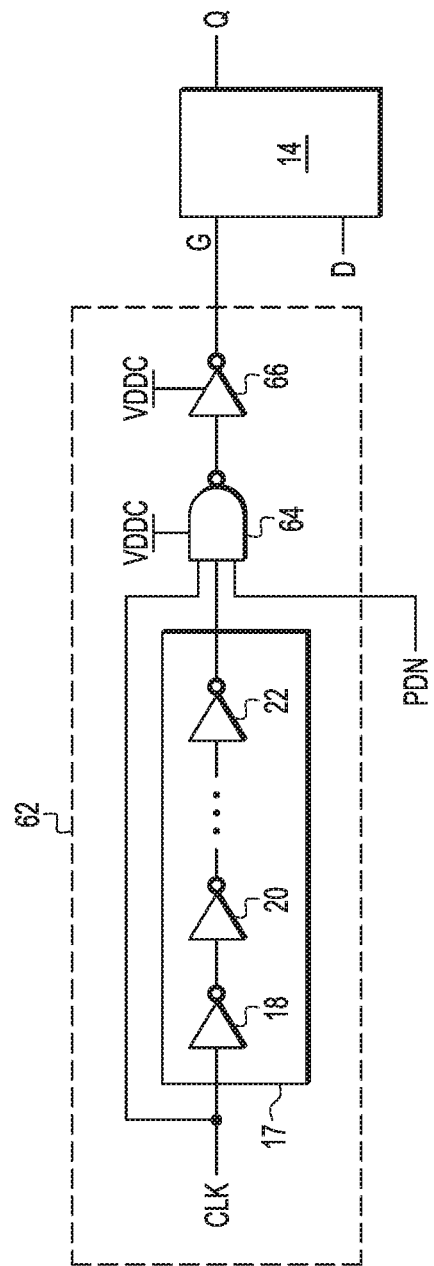
FIG. 4 illustrates, in schematic form, a pulsed latch system have a pulse generator and a pulsed latch, in accordance with another embodiment of the present invention.

FIG. 4 illustrates, in schematic form, a pulsed latch system 60 which includes pulsed latch 14 with state retention and a pulse generator 62 having an embedded power down signal, in accordance with one embodiment of the present invention. In the embodiment of FIG. 4, pulse latch generator 62 with the embedded power down signal replaces pulse latch generator 12 and device 16. Pulse generator 62 includes delay chain 17, described above, a 3-input NAND gate 64, and an inverter 66. A first input of NAND gate 64 is coupled to received CLK, a second input of NAND gate is coupled to receive the output of delay chain 17, and a third input of NAND gate is coupled to receive an active low power down signal, PDN. In the illustrated embodiment, since PDN is active low, when PDN is asserted at a logic level low, system 60 is operating in a power down mode (e.g. a low power mode) and when PDN is negated at a logic level high, system 60 is in normal operation. An input of inverter 66 is coupled to receive an output of NAND gate 64 and an output of inverter 66 is coupled to the first input G of latch 14. NAND gate 64 and inverter 66 are coupled to the third power supply node which receives continuous power supply, VDDC.

During normal operation, when power is applied such that VDD and VDDC are both powered, PDN is a logic level high. With PDN at a logic level high, the combination of NAND gate 64 and inverter 66 operate similar to AND gate 24 (when PD is a logic level low). That is, during normal operation, a pulse is applied to input G in response to each rising edge of CLK, in which the pulse width of the pulse is determined by the delay of chain 17. Note that latch 14 operates as described above. That is, each time a pulse is received at input G, from pulse generator 62, the value at D is latched and provided as Q.

When a power down mode (e.g. a low power mode) is to be entered, PDN is asserted to a logic level low which forces the output of NAND gate 64 to be a logic level high and the output of inverter 66 at input G to be a logic level low. With PDN being a logic level low during the power down mode, the state of CLK can either be held at a predetermined state (which may be high or low) because the output of NAND gate 64 is independent of the clock state. Therefore, in one embodiment, when power down mode is to be entered, CLK can be set high or low, as desired, and one cycle later, PDN is asserted to a logic level low. At some point later, VDD is turned off. Again, with VDDC continuously applied, even during power down mode, the state of pulsed latch 14 remains stored in the latch formed by inverters 30 and 32 and transmission gate 27. Upon exiting the power down mode, VDD is first restored, and PDN is again negated to a logic level high. One cycle after PDN is negated, the CLK is no longer held at the predetermined state (high or low) such that normal operation resumes. Note that the timing diagram for FIG. 4 would be similar to FIG. 3 except that rather than PD going to a logic level high during power down, PDN would go to a logic level low during the power down, and CLK can be held either high or low during power down.

Figure 5:
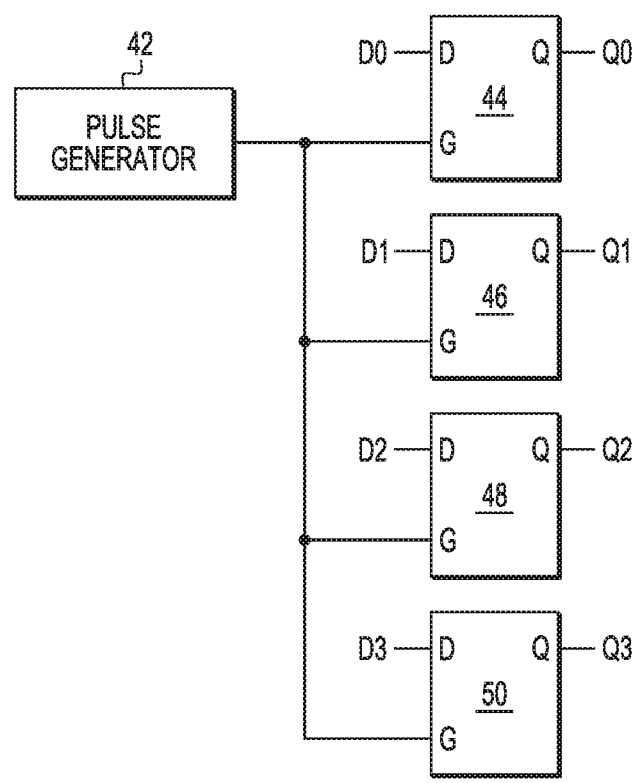
FIG. 5 illustrates, in partial schematic and partial block diagram form, a multiple bit (multi-bit) pulsed latch in accordance with one embodiment of the present invention.

As discussed above, a pulsed latch requires some overhead due to the need of a pulse generator, this overhead can be mitigated by using the pulse clock generator in a multi-bit configuration. FIG. 5 illustrates, in partial block diagram form and partial schematic form, a multi-bit pulsed latch system 40. System 40 includes 4 pulsed latches, 44, 46, 48, and 50, and a pulse generator 42 shared by the 4 pulsed latches. Either pulse generator 12 or pulse generator 62 may be used as pulse generator 42, and the description of pulsed latch 14 above applies to each of the 4 pulsed latches. That is, pulse generator 42 may be similarly powered by VDD and pulsed latches 44, 46, 48, and 50, may be powered in part by VDD and in part by VDDC, as discussed in reference to FIGS. 1 and 2.

In operation, pulse generator 42 generates a pulse at the G inputs of the latches. Each time a pulse is received at G, the corresponding value of D is latched and provided as the corresponding output Q. Therefore, D0 is latched as Q0, D1 as Q1, D2 as Q2, and D3 as Q3. Therefore, with each pulse of the pulse generator 42, a 4-bit value, D0-D3, is latched and provided as Q0-Q3, respectively. In this manner, the overhead of only one pulse generator is needed for multiple pulsed latches. In alternate embodiments, N pulsed latches, where N is any integer number greater than 1, can share a pulse generator.

Therefore, by now it can be appreciated how a pulsed latch with state retention utilizes two separate voltage supplies, a continuous supply and a switchable supply, to reduce power in an integrated circuit. Furthermore, power is reduced while allowing for state retention. Further area savings can be achieved by using a shared pulse generator among multiple pulsed latches in a multi-bit configuration.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Also for example, in one embodiment, the illustrated elements of system 10 and 40 are circuitry located on a single integrated circuit or within a same device or SoC. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the pulsed latches herein can be designed using different circuitry for the latch and for the state retention, where the different pulsed latch designs utilize a combination of the continuous power supply and switchable power supply. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit includes a pulse generator including: at least one delay circuit having an input that receives a clock signal and an output that provides a delayed clock pulse, wherein the delayed clock pulse has a width proportional to an amount of time required to maintain a magnitude of the clock signal; and a pulse latch circuit including a clock input coupled to receive the delayed clock pulse, a data input coupled to receive a data value, and a data output, wherein the pulse latch circuit outputs and holds the data value at the data output each time the delayed clock pulse is provided at the clock input, and the pulse latch circuit operates on a continuous voltage source that supplies power during power on and power off modes. In one aspect of the above one embodiment, the integrated circuit further includes a logic gate circuit coupled to a non-continuous voltage source that provides a non-zero supply voltage only in a power-on mode, the logic gate circuit including a first input coupled to the output of the at least one delay circuit and a second input coupled to the clock signal and an output coupled to the clock input of the latch circuit. In another aspect, the pulse generator further includes: a logic gate circuit coupled to the continuous voltage source, the logic gate circuit including a first input coupled to the output of the at least one delay circuit, a second input coupled to the clock signal, a third input coupled to a power down signal, and an output coupled to the clock input of the latch circuit. In another aspect, the integrated circuit further includes the pulse generator includes an odd number of the at least one delay circuit. In a further aspect, the at least one delay circuit is an inverter. In another aspect of the above one embodiment, the latch circuit includes: a first transmission gate having an input coupled to the data input, an output, a first control input coupled to the delayed clock pulse, a second control input coupled to a complement of the delayed clock pulse, and an output; a first inverter coupled to operate on the continuous voltage source and having an input coupled to the output of the first transmission gate, and an output, wherein the continuous voltage source provides a non-zero supply voltage in both power-on and power-down modes; a second inverter coupled to operate on a non-continuous voltage source and including an input coupled to the output of the first inverter and the data output, wherein the non-continuous voltage source provides a non-zero supply voltage only in the power-on mode. In a further aspect, the latch circuit further includes: a third inverter having an input coupled to the delayed clock pulse, and an output coupled to provide the complement of the delayed clock pulse to a first control input of a second transmission gate and the second control input of the first transmission gate; a fourth inverter coupled to the continuous voltage source and having an input coupled to the output of the first inverter and an output coupled to an input of the second transmission gate; the second transmission gate further includes a second control input coupled to the delayed clock pulse and an output coupled to the input to the first inverter. In yet another aspect, the integrated circuit further includes one or more additional latch circuits configured to receive the delayed clock pulse from the pulse generator. In another aspect, the integrated circuit further includes a switch configured to remove the delayed clock pulse from the clock input of the pulsed latch during power-down mode.

In another embodiment, an integrated circuit includes a latch circuit including first and second inverters powered by an always-on voltage supply and configured with a first switch connected between an input of the first inverter and an output of the second inverter, wherein the switch is open during power-up and closed during power-down to enable the first and second inverters to retain data during power-down; a pulse generator coupled to a clock input of the latch circuit, wherein the pulse generator is configured to pass a clock signal through one or more delay elements to generate a delayed clock pulse signal that is provided to the clock input. In one aspect, the latch circuit further includes a second switch connected between a data input and the input of the first inverter, the second switch being open during power-down and closed during power-up. In another aspect, the latch circuit further includes an output of the first inverter is coupled to an input of the second inverter. In yet another aspect, the latch circuit further includes a third inverter including an input coupled to the output of the first inverter and the input to the second inverter, and an output that provides a latched data signal. In another further aspect, the latch circuit further includes a fourth inverter that includes an input coupled to the output of the pulse generator to receive the delayed clock pulse signal and an output coupled to a control gate input of the first switch and a control gate input of the second switch. In a further aspect, the first switch includes an N-channel transistor having a control gate configured to receive the delayed clock pulse signal and a P-channel transistor having a control gate configured to receive a complement of the delayed clock pulse signal from the fourth inverter. In another further aspect, the second switch includes a P-channel transistor having a control gate configured to receive the delayed clock pulse signal and an N-channel transistor having a control gate configured to receive a complement of the delayed clock pulse signal from the fourth inverter. In yet another further aspect, the one or more delay elements are inverters connected in series. In yet a further aspect, the pulse generator further includes a logic AND gate circuit including a first input coupled to the output of a last one of the one or more delay elements, a second input coupled to the clock signal, and an output coupled to the clock input of the latch circuit. In another aspect of the another embodiment, the integrated circuit further includes an N-channel transistor having a first current electrode coupled to the clock input of the latch circuit, a second current electrode coupled to ground and a control gate electrode coupled to a power down signal.

In yet another embodiment, a method of operating a pulsed latch circuit includes conducting a rising edge of a clock signal through one or more delay elements to generate a delayed clock signal; when the clock signal is high and a power down signal is not asserted, providing the delayed clock signal to the pulsed latch circuit; providing continuous voltage to first, second and third inverters in the pulsed latch circuit during power-down and power-up modes; providing supply voltage to a fourth inverter only during power-up modes, providing a data signal to an input of the first inverter only when the delayed clock signal is high, wherein an output of the first inverter is coupled to an input of the second and fourth inverters; providing the data signal to the input of the first inverter from an output of the second inverter only when the delayed clock signal is low.

What is claimed is:
1. An integrated circuit comprising:
 a pulse generator including:
  a logic gate circuit configured to operate on a non-continuous voltage source that does not supply power during power off modes;
  at least one delay circuit having an input that receives a clock signal and an output that provides a delayed clock signal, wherein a first input of the logic gate circuit is coupled to the clock signal and a second input of the logic gate circuit is coupled to the output of the at least one delay circuit, and an output of the logic gate circuit provides a delayed clock pulse which has a width proportional to a delay time provided by the at least one delay circuit;
 a pulse latch circuit including a clock input coupled to receive the delayed clock pulse, a data input coupled to receive a data value, and a data output, wherein the pulse latch circuit outputs and holds the data value at the data output each time the delayed clock pulse is provided at the clock input, and the pulse latch circuit operates on a continuous voltage source that supplies power during power on and power off modes.
2. The integrated circuit of claim 1 wherein
 the non-continuous voltage source provides a non-zero supply voltage only in a power-on mode, and the output of the logic gate circuit is coupled to the clock input of the pulse latch circuit.
3. The integrated circuit of claim 1 further comprising:
 the pulse generator includes an odd number of the at least one delay circuit.
4. The integrated circuit of claim 3 wherein
 the at least one delay circuit is an inverter.
5. The integrated circuit of claim 1, wherein
 the latch circuit includes:
  a first transmission gate having an input coupled to the data input, an output, a first control input coupled to the delayed clock pulse, a second control input coupled to a complement of the delayed clock pulse, and an output;
  a first inverter coupled to operate on the continuous voltage source and having an input coupled to the output of the first transmission gate, and an output, wherein the continuous voltage source provides a non-zero supply voltage in both power-on and power-down modes;
  a second inverter coupled to operate on a non-continuous voltage source and including an input coupled to the output of the first inverter and the data output, wherein the non-continuous voltage source provides a non-zero supply voltage only in the power-on mode.

6. The integrated circuit of claim 5, wherein the latch circuit further includes:
   a third inverter having an input coupled to the delayed clock pulse, and an output coupled to provide the complement of the delayed clock pulse to a first control input of a second transmission gate and the second control input of the first transmission gate;
   a fourth inverter coupled to the continuous voltage source and having an input coupled to the output of the first inverter and an output coupled to an input of the second transmission gate;
   the second transmission gate further includes a second control input coupled to the delayed clock pulse and an output coupled to the input to the first inverter.

7. The integrated circuit of claim 1 further comprising:
   one or more additional latch circuits configured to receive the delayed clock pulse from the pulse generator.

8. The integrated circuit of claim 1 further comprising:
   a switch having a first current electrode coupled to the clock input of the pulse latch circuit and a second current electrode coupled to ground, wherein the switch is configured to remove the delayed clock pulse from the clock input of the pulse latch circuit during power-off mode.

9. The integrated circuit of claim 8, wherein the switch is configured to pull the clock input of the pulse latch circuit to ground during power-off mode.

10. An integrated circuit, comprising:
    a latch circuit including first and second inverters powered by an always-on voltage supply and configured with a first switch connected between an input of the first inverter and an output of the second inverter, wherein the switch is open during power-up and closed during power-down to enable the first and second inverters to retain data during power-down;
    a pulse generator coupled to a clock input of the latch circuit, wherein the pulse generator is configured to pass a clock signal through one or more delay elements to generate a delayed clock pulse signal that is provided to the clock input; and
    an N-channel transistor having a first current electrode coupled to the clock input of the latch circuit, a second current electrode coupled to ground and a control gate electrode coupled to a power down signal.

11. The integrated circuit of claim 10, wherein the latch circuit further comprises:
    a second switch connected between a data input and the input of the first inverter, the second switch being open during power-down and closed during power-up.

12. The integrated circuit of claim 11 wherein the latch circuit further comprises:
    a fourth inverter that includes an input coupled to the output of the pulse generator to receive the delayed clock pulse signal and an output coupled to a control gate input of the first switch and a control gate input of the second switch.

13. The integrated circuit of claim 12 wherein the first switch includes a P-channel transistor having a control gate configured to receive the delayed clock pulse signal and an N-channel transistor having a control gate configured to receive a complement of the delayed clock pulse signal from the fourth inverter.

14. The integrated circuit of claim 12 wherein the second switch includes an N-channel transistor having a control gate configured to receive the delayed clock pulse signal and a P-channel transistor having a control gate configured to receive a complement of the delayed clock pulse signal from the fourth inverter.

15. The integrated circuit of claim 12 wherein the one or more delay elements are inverters connected in series.

16. The integrated circuit of claim 15 wherein the pulse generator further comprises:
    a logic AND gate circuit including a first input coupled to the output of a last one of the one or more delay elements, a second input coupled to the clock signal, and an output coupled to the clock input of the latch circuit.

17. The integrated circuit of claim 10 wherein the latch circuit further comprises:
    an output of the first inverter is coupled to an input of the second inverter.

18. The integrated circuit of claim 10 wherein the latch circuit further comprises:
    a third inverter including an input coupled to the output of the first inverter and the input to the second inverter, and an output that provides a latched data signal.

19. The integrated circuit of claim 10 wherein the N-channel transistor is configured to pull the clock input of the latch circuit to ground when the power down signal is asserted.

* * * * *